(12) United States Patent
Yan et al.

(10) Patent No.: US 11,353,390 B2
(45) Date of Patent: Jun. 7, 2022

(54) METHODS TO REDUCE POWER CONSUMPTION OF AN OPTICAL PARTICLE SENSOR VIA AN ASIC DESIGN

(71) Applicant: Apple Inc., Cupertino, CA (US)

(72) Inventors: Miaolei Yan, Santa Clara, CA (US);
Gregory B. Arndt, San Jose, CA (US);
Mehmet Mutlu, Stanford, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/725,951

(22) Filed: Dec. 23, 2019

(65) Prior Publication Data

US 2020/0209133 A1   Jul. 2, 2020

Related U.S. Application Data

(60) Provisional application No. 62/785,481, filed on Dec. 27, 2018.

(51) Int. Cl.
*G01B 9/02056* (2022.01)
*G01N 15/06* (2006.01)
*H03M 1/12* (2006.01)
*G01B 9/02017* (2022.01)

(52) U.S. Cl.
CPC ......... *G01N 15/06* (2013.01); *G01B 9/02017* (2013.01); *G01B 9/02057* (2013.01); *G01N 2015/0693* (2013.01); *H03M 1/12* (2013.01)

(58) Field of Classification Search
CPC . G01N 15/06; G01N 2015/0693; H03M 1/12; G01B 9/02017; G01B 9/0201; G01B 9/02057; G01B 9/02087

USPC .................. 356/342, 335–337, 237.1–237.6
See application file for complete search history.

(56) References Cited

U.S. PATENT DOCUMENTS

| 3,846,024 | A | * | 11/1974 | Turner | G01J 3/32 356/329 |
| 5,636,248 | A | * | 6/1997 | Tash | H04J 3/047 375/282 |
| 6,579,235 | B1 | * | 6/2003 | Abita | A61B 3/16 600/398 |
| 6,771,370 | B2 | * | 8/2004 | Sevick-Muraca | G01N 15/0211 356/336 |
| 10,914,665 | B2 | * | 2/2021 | Park | G01N 21/85 |
| 2003/0053235 | A1 | * | 3/2003 | Kikugawa | G11B 27/36 360/31 |

(Continued)

*Primary Examiner* — Isiaka O Akanbi
(74) *Attorney, Agent, or Firm* — BakerHostetler

(57) ABSTRACT

A portable communication device includes one or more optical detectors to generate an analog signal in response to a change in an intra-cavity or an emitted optical power of a light source due to light backscattered from a particle and an application-specific integrated circuit (ASIC). The particle is illuminated via a light source. The ASIC includes an analog-to-digital converter (ADC) circuit, a digital delay circuit, a particle detector module and a processor. The ADC converts the analog signal to a digital signal. The digital delay circuit can store the digital signal for a predetermined or dynamically variable time interval. The particle detector module can analyze the digital signal and can generate an enable signal upon detecting a particle signature in the digital signal. The processor is coupled to the digital delay circuit and can start processing the digital signal in response to the enable signal.

20 Claims, 6 Drawing Sheets

(56) References Cited

U.S. PATENT DOCUMENTS

| | | | |
|---|---|---|---|
| 2005/0286649 A1* | 12/2005 | Redfern | H04L 27/2675 375/260 |
| 2007/0013899 A1* | 1/2007 | Wolters | H01J 43/30 356/237.2 |
| 2008/0319680 A1* | 12/2008 | Fox | G01N 15/147 702/21 |
| 2009/0015295 A1* | 1/2009 | Aoki | H03D 1/18 327/58 |
| 2009/0299655 A1* | 12/2009 | Biellak | H01L 22/12 702/40 |
| 2015/0229319 A1* | 8/2015 | Aggrawal | H03M 1/12 341/155 |
| 2016/0202164 A1* | 7/2016 | Trainer | G01N 15/0211 356/336 |

* cited by examiner

| | DUTY CYCLE | ADC BIT |
|---|---|---|
| ALWAYS ON MODE (LOW POWER) | 99% | 4 |
| DETECTION MODE (HIGH POWER) | 1% | 12 |
| POWER REDUCTION (%) | - | 98.6% |

METHODS TO REDUCE POWER CONSUMPTION OF AN OPTICAL PARTICLE SENSOR VIA AN ASIC DESIGN

CROSS-REFERENCE TO RELATED APPLICATION

This application claims the benefit of U.S. Provisional Application No. 62/785,481, entitled "METHODS TO REDUCE POWER CONSUMPTION OF AN OPTICAL PARTICLE SENSOR VIA AN ASIC DESIGN," filed Dec. 27, 2018, the entirety of which is incorporated herein by reference.

TECHNICAL FIELD

The present description relates generally to sensor technology, and more particularly to methods of reducing power consumption of an optical particle sensor via an application-specific integrated circuit (ASIC) design.

BACKGROUND

Many mobile electronic devices are equipped with sensors and transducers that enable the devices to perform far more functionalities than communications. Media playing, photography, location detection, online shopping, social media, online banking, calendar and health applications such as heartbeat, blood pressure and blood oxygen level measurement are among the numerous applications that a smart mobile communication device can facilitate. Further, smart mobile communication devices (e.g., smartphones and smartwatches) can be equipped with sensors for a number of environmental applications such as pressure measurement, gas and particulate matter (PM) detection and analysis.

PM includes microscopic solids or liquid droplets that can be inhaled and lead to serious health problems in the human body. PM is a dominant air pollutant, and it is known that air pollution causes many premature deaths globally each year. Mobile communication devices (e.g., smartphone and smartwatches) integrated with miniature PM sensors can offer innovative features such as personal PM detection, unhealthy PM alerts and personal PM exposure calculation and analysis. Such features may rely on the automatic operation of the PM sensor in the background. However, the high power consumption of the PM sensors, when the sensor is in an active state, can be, for example, on the order of hundreds of milliwatts (mWs) that would take a toll on the device battery life. In particular, the sensor ASIC can contribute to most of the power usage.

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

Figure 1:
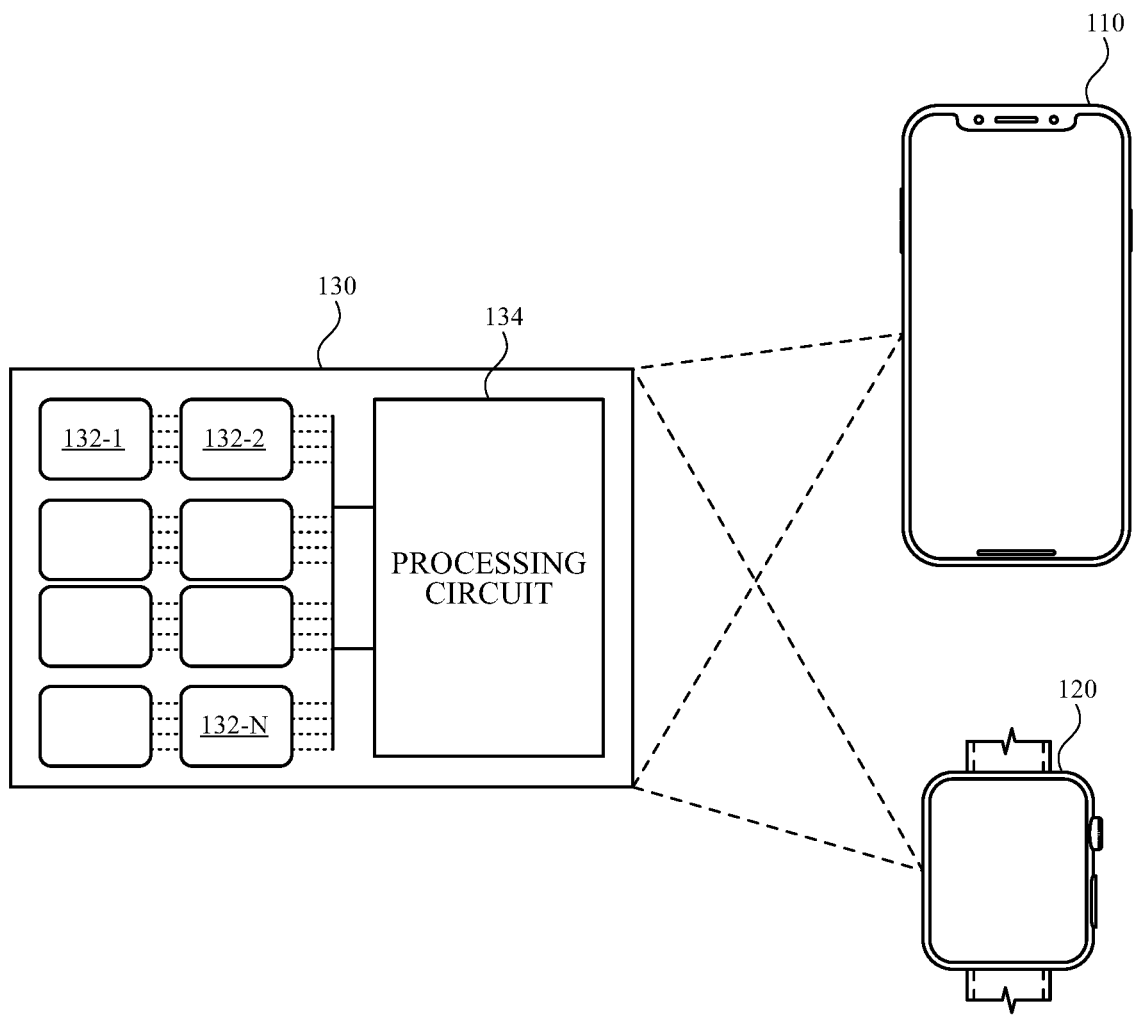
FIG. 1 is a high-level diagram illustrating examples of portable communication devices with environmental sensing capability, in accordance with one or more aspects of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in block diagram form in order to avoid obscuring the concepts of the subject technology.

In one or more aspects, the subject technology is directed to systems and methods for reducing power consumption of an optical particulate matter (PM) sensor, for consumer electronic devices such as mobile communication devices (e.g., smartphones and smartwatches). The reduction in power consumption results in an extended battery life that facilitates integration of the PM sensor into mobile platforms. In the subject disclosure, four different application-specific integrated circuit (ASIC) designs for power consumption reduction of an optical PM sensor are described. The optical PM sensor is based on optical feedback interferometry principles and is capable of detecting airborne particles individually and calculating the PM concentration. In some implementations, the subject technology can be implemented as a stand-alone device. Integration of environmental sensors such as PM sensors with consumer electronic platforms is valuable, as it could enable new features such as environmental and health monitoring and other various features.

The subject technology can be realized as an ASIC. The ASIC can be coupled to an optical detector to receive an analog signal from the optical detector. The detector generates the analog signal in response to detecting a scattered light from a particle illuminated by an optical source (e.g., a laser). In some sensors, the detector generates the analog signal in response to a change in the intra-cavity or emitted optical power of a light source (e.g., laser) due to light backscattered from a particle.

In some implementations, the ASIC includes an analog-to-digital converter (ADC) circuit, a digital delay circuit, a particle detector module and a processor. The ADC converts the analog signal to a digital signal. The digital delay circuit can store the digital signal for a predetermined or dynamically variable time interval. The particle detector module can analyze the digital signal and can generate an enable signal upon detecting a particle signature. The processor is coupled to the digital delay circuit and can start processing the digital signal in response to the enable signal, as discussed in more detail herein.

In one or more implementations, the ASIC includes an analog front-end (AFE) circuit, a first ADC, a particle detector module, a second ADC and a dedicated processor. The AFE circuit can condition the analog signal for digital conversion. The conditioning may include amplification, filtering and so on. The first ADC circuit can convert the analog signal to a first digital signal in response to receiving an enable signal from the second ADC circuit. The second ADC circuit can convert the conditioned analog signal to a second digital signal. The particle detector module analyzes the second digital signal and generates the enable signal upon detecting a particle signature in the second digital signal, as discussed in more detail herein.

In some implementations, the ASIC includes an amplifier circuit, an envelope detector, a single-ended or a differential amplifier, a comparator circuit and a mixed-signal circuit. The amplifier circuit receives a first signal from the optical detector and generates a second signal. The envelope detector can detect positive and negative envelopes of the second signal and generate a differential envelope signal. The differential amplifier receives the differential envelope signal and generates a voltage signal. The comparator circuit compares the voltage signal to a threshold voltage and generates an enable signal, in response to the voltage signal exceeding the threshold voltage. In some implementations, the amplifier can be a single-ended (e.g., a non-differential) amplifier. For this case, the envelope detector can generate one of the positive or negative envelopes. The generated envelope can then be compared to a lower threshold voltage, as compared to the case of the differential envelope signal. The mixed-signal circuit includes an ADC circuit and a dedicated processor and uses the enable signal to reduce power consumption of the ADC circuit or the dedicated processor, as described in more detail herein.

The various implementations described above provide an ASIC that consumes significantly less power, as the power-hungry components such as high-speed and high-resolution ADCs and/or the processors are in a standby mode (e.g., sleep) for most of the time and are enabled (e.g., awakened) only when a particle signature is detected by the particle detector module, as explained in the following with respect to various figures described herein.

FIG. 1 is a high-level diagram illustrating examples of portable communication devices with environmental sensing capability, in accordance with one or more aspects of the subject technology. Many sensing capabilities including PM detection related to the subject technology can be integrated with a portable communication device such as a smartphone 110 or a smartwatch 120 to enable smartphone 110 or smartwatch 120 to sense environmental parameters, for example, detection of PM such as microscopic solids or liquid droplets that can be inhaled and lead to serious health problems. Smartphone and smartwatch 110 can communicate with other devices using one or more communication protocols such as Wi-Fi, cellular, Bluetooth, near-filed communications (NFC) and/or other communication protocols.

The portable communication device of the subject technology (e.g., smartphone 110 or smartwatch 120) includes an environmental sensing chip 130 that can communicate with other components of the portable communication device such as a central processor and memory (e.g., no-volatile or volatile memory) of the portable communication device. Environmental sensing chip 130 (hereinafter, "chip 130") may include a number of environmental sensors 132 (e.g., patches 132-1, 132-2 . . . 132-N) and a processing circuit 134. Chip 130 can be a semiconductor chip such as a silicon chip or a chip made of other semiconductor materials, for example, an ASIC of the subject technology.

Environmental sensors 132 can be various sensors for pressure measurement, gas detection and PM detection and analysis. Each environmental sensor 132 is connected to a pair of electrodes. The electrodes are continuously monitored and the measured parameters may be reported, for example, to a central processing unit (CPU) of the portable communication device.

In some implementations, the processing circuit 134 integrated on the chip 130 and interfaced with environmental sensors 132 can provide biasing for and process the output signal from environmental sensors 132. In some implementations, processing circuit 134 is the ASIC of the subject technology and includes power-reducing features implemented by a number of circuits and components as described herein.

Figure 2:
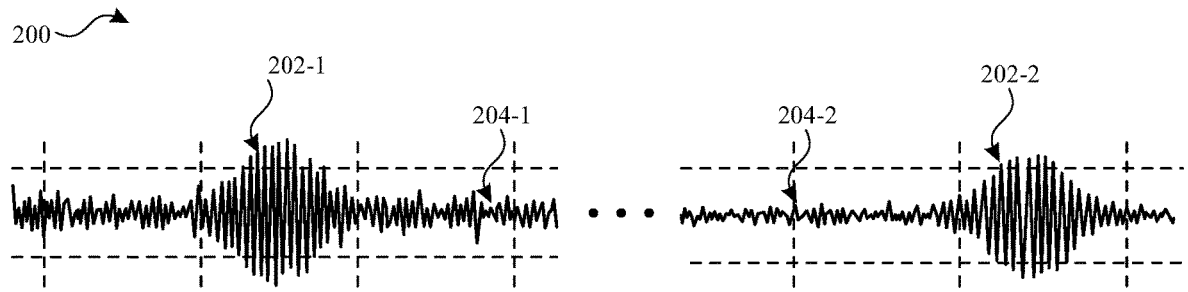
FIG. 2 is a diagram illustrating example particle signals and the corresponding noise floors.

FIG. 2 is a diagram illustrating example particle signals 200 and the corresponding noise floors. Example particle signals shown in FIG. 2 are generated by an optical detector (e.g., a photodetector such as a photodiode) or counter that can detect the change in the intra-cavity or emitted optical power of a light source (e.g., a laser) in response to light backscattered from particles entering a sensing volume (cavity) of particle detector housing. A light beam of a light source, such as a laser, is used to illuminate the particles.

Whenever a particle passes through the sensing volume, a small portion of the laser light back-scatters into the laser cavity. In response to this back-scattered portion, the laser achieves a new steady state, containing in its cavity and emitting a different amount of optical power. The photodiode is configured to detect the changes in the optical power contained in the laser cavity (i.e., intra-cavity laser power) or emitted by the laser (i.e., emitted laser power). In this sensing configuration, a particle passing through the sensing volume induces an electrical signal, also referred to as particle signals 202 (e.g., 201-1 and 202-2). For example, particle signals 202-1 and 202-2 may be associated with different particles. In some implementations, particle signals 202 can be used to calculate particle velocity and estimate particle concentration. Once the particle leaves the sensing volume, the back-scattered light intensity becomes zero and the photodetector signal returns to noise signals (also referred to as noise floor) 204. Thus, particle detections are discretized events. Particle signals 202 are relatively short pulses (e.g., spanning from about 1 microsecond to about 1 millisecond, depending on particle velocity) of particle scattering signals. Particle signals 202 are separated by much longer periods (e.g., of the order of about hundreds of milliseconds) of noise signals in between. Accordingly, the total duration of the useful particle signals (e.g., 202) is typically small. For example, in a clean office environment, the useful portion of the particle signals can be much less than one percent.

However, the conventional ASIC attached to the particle sensor runs at 100% duty cycle, as the particles arrival events are stochastic and unpredictable. Otherwise, failure to capture the particle signals would lead to inaccurate estimation of PM concentration. The subject technology provides solutions that allow the enabling of the power-hungry portions of the ASIC, such as a dedicated processor or a high-speed and high-resolution ADC, only when a particle signal is detected, as discussed herein. This results in substantial power savings, as the power-hungry portions of the ASIC are used a small fraction of the time and are otherwise inactive (e.g., sleep).

Figure 3:
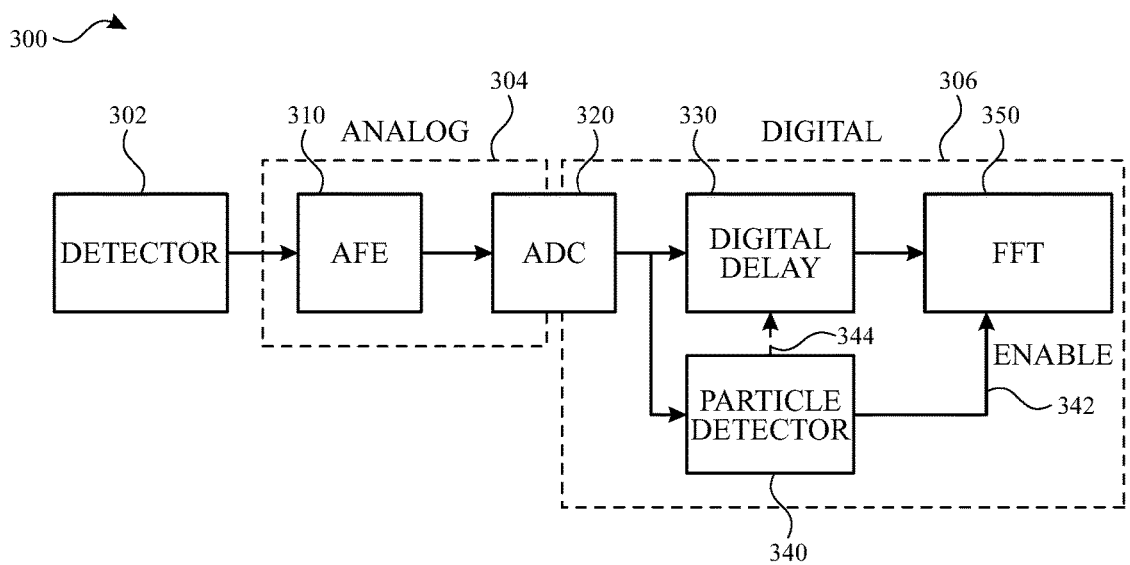
FIG. 3 is a block diagram illustrating an example circuit using a digital delay to reduce power consumption in an optical particle detection device, in accordance with one or more aspects of the subject technology.

FIG. 3 is a block diagram illustrating an example circuit 300 using a digital delay to reduce power consumption in an optical particle detection device, in accordance with one or more aspects of the subject technology. Example circuit 300 includes a detector 302 and an ASIC including an analog section 304 and a digital section 306. Analog section 304 includes an AFE circuit 310 and a first portion of an ADC circuit 320, and digital section 306 includes a second section of ADC circuit 320, a digital delay circuit 330, a particle detector module 340 and a dedicated processor 350.

Detector 302 is an optical detector (e.g., a photodetector such as a photodiode) that can generate an analog signal in response to a change in the intra-cavity or emitted optical power of a light source (e.g., laser) due to light backscattered from particles entering a sensing volume (cavity) of a particle detector housing. The particles in the sensing volume of the particle sensor housing are illuminated by a light beam of a laser suitably placed in the sensor housing. The AFE circuit 310 includes analog circuitry such as filters, amplifiers and other components for conditioning the analog signal generated by detector 302 for digital conversion. ADC circuit 320 can be any suitable type of ADC circuit and converts the conditioned analog signal to a digital signal (e.g., including bits). Digital delay circuit 330 can be a digital storage circuit, for example, random access memory (RAM), capable of storing the digital signal for a predetermined or dynamically variable time interval.

Particle detector module 340 can be implemented in hardware or firmware and can detect a signature of a particle, for example, distinguish particle signals 202 of FIG. 2 from noise floor (e.g., 204 of FIG. 2). Particle detector module 340 may use an algorithm such as a thresholding algorithm to detect the particle signal. Upon detection of a particle signal, particle detector module 340 generates an enable signal 342 that is received by dedicated processor 350. The dedicated processor may be any processor such as a microcontroller capable of implementing a fast-fourier transform (FFT) process of the stored digital signal and generating a frequency spectrum including a frequency-domain characteristic of the digital signal. The frequency spectrum can be used by an algorithm, for example, of a digital-signal processor (DSP), to analyze particle data, for instance to provide particle concentration. In some implementations, dedicated processor 350 is automatically disabled, for example, inactivated such as switched to a standby mode or sleep mode, immediately after finishing the processing of the particle signal to be enabled again by the next enable signal. The next enable signal may be received, for example, milliseconds after the first one. This allows dedicated processor 350 to consume significantly less power.

In one or more implementations, particle detector module 340 may further send a signal 344 (e.g., a release signal) to digital delay circuit 330 to command digital delay circuit 330 to release the stored digital data to dedicated processor 350. In some implementations, the predetermined time interval for storage of the digital data by digital delay circuit 330 is programmable and can be set to suitable value based on particle characteristics such as the longest anticipated travel time of a particle through the sensing volume (cavity) of the particle detector housing plus the processing time of particle detector 340. In some implementations, the predetermined time interval can be dynamically variable and be changed during the operation of the sensor. For example, when some estimates of the speed of a particle is available (e.g., based on measurements), the predetermined time interval can be tuned to the longest anticipated travel time of a particle moving with the same or a similar speed. As such, further power saving can be enabled by reducing the memory size for fast moving particles.

Figure 4:
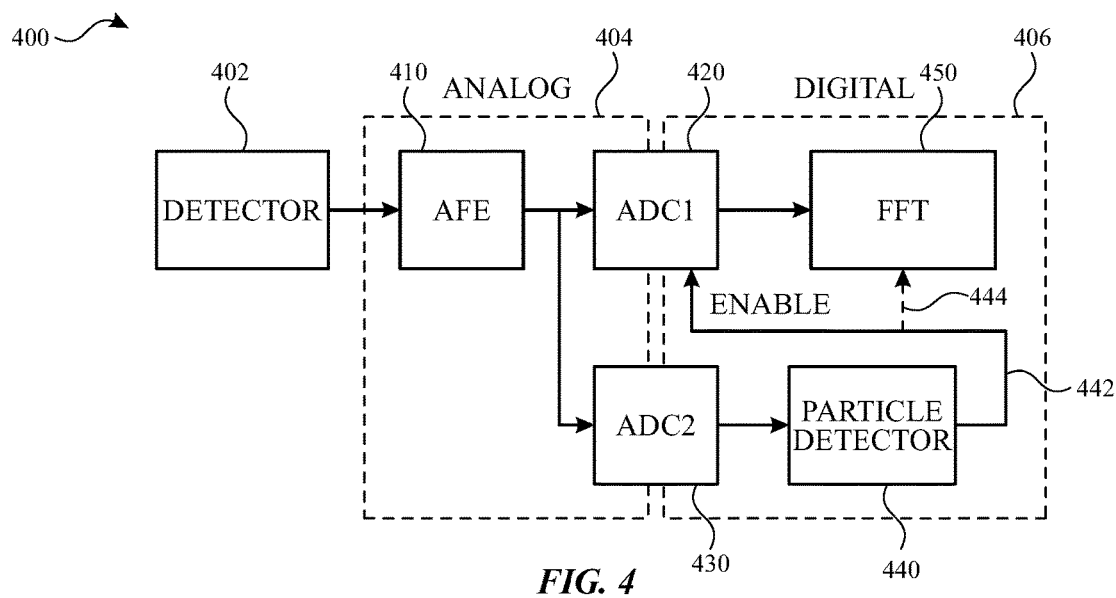
FIG. 4 is a block diagram illustrating an example circuit using two analog-to-digital converters (ADCs) to reduce power consumption in an optical particle detection device, in accordance with one or more aspects of the subject technology.

FIG. 4 is a block diagram illustrating an example circuit 400 using two ADCs to reduce power consumption in an optical particle detection device, in accordance with one or more aspects of the subject technology. Example circuit 400 includes a detector 402 and an ASIC including an analog section 404 and a digital section 406. Detector 402 is an optical detector similar to the detector 302 of FIG. 3. Analog section 404 includes an AFE circuit 410, a first portion of a first ADC 420 and a first portion of a second ADC 430. Digital section 406 includes a second section of first ADC 420, a second section of second ADC 430, a particle detector module 440 and a dedicated processor 450.

In one or more embodiments, AFE circuit 410, particle detector module 440 and dedicated processor 450 are is similar to AFE circuit 310, particle detector 340 and dedicated processor 350 of FIG. 3. In one or more implementations, first ADC 420 is a high-speed and high-resolution ADC. The high-speed ADC has a conversion speed higher than 10 mega samples per second (MSPS), for example, 20 MSPS, and the high-resolution ADC has a resolution better than 8 bits. In some implementations, second ADC 430 is a low-speed and low-resolution ADC. The low-speed ADC has a conversion speed lower than about 10 MSPS, and the low-resolution ADC has a resolution lower than 8 bits.

In some implementations, second ADC 430 can be a low-speed ADC or a high-speed and low-resolution ADC. As described above with respect to AFE circuit 310, AFE circuit 410 conditions the analog signal from detector 402 for digital conversion. In general, first ADC 420, which has a high power consumption, is in a standby mode, and the digital conversion of the conditioned analog signal is performed by the lower-power second ADC 430. The digital signal from second ADC 430 is sent to particle detector module 440, which can detect a particle signal (signature) and, upon such a detection, sends an enable signal 442 to first ADC 420. First ADC 420, in response to the enable signal 442, converts the conditioned analog signal and sends a generated digital signal to dedicated processor 450 for processing, as explained with respect to FIG. 3.

In one or more implementations, particle detector module 440 can send the enable signal 442 to dedicated processor 450, as well. In these implementations, dedicated processor 450 is in a standby (sleep) mode, unless it receives an enable signal 442 that causes dedicated processor 450 to switch to an active (awake) mode. Thus, using example circuit 400 of the subject technology can significantly reduce power consumption, as the high-speed and high-resolution ADC (e.g., first ADC 420), which digitizes the actual particle signals, is active (awake) only a small fraction of the time.

Figures 5, 6:
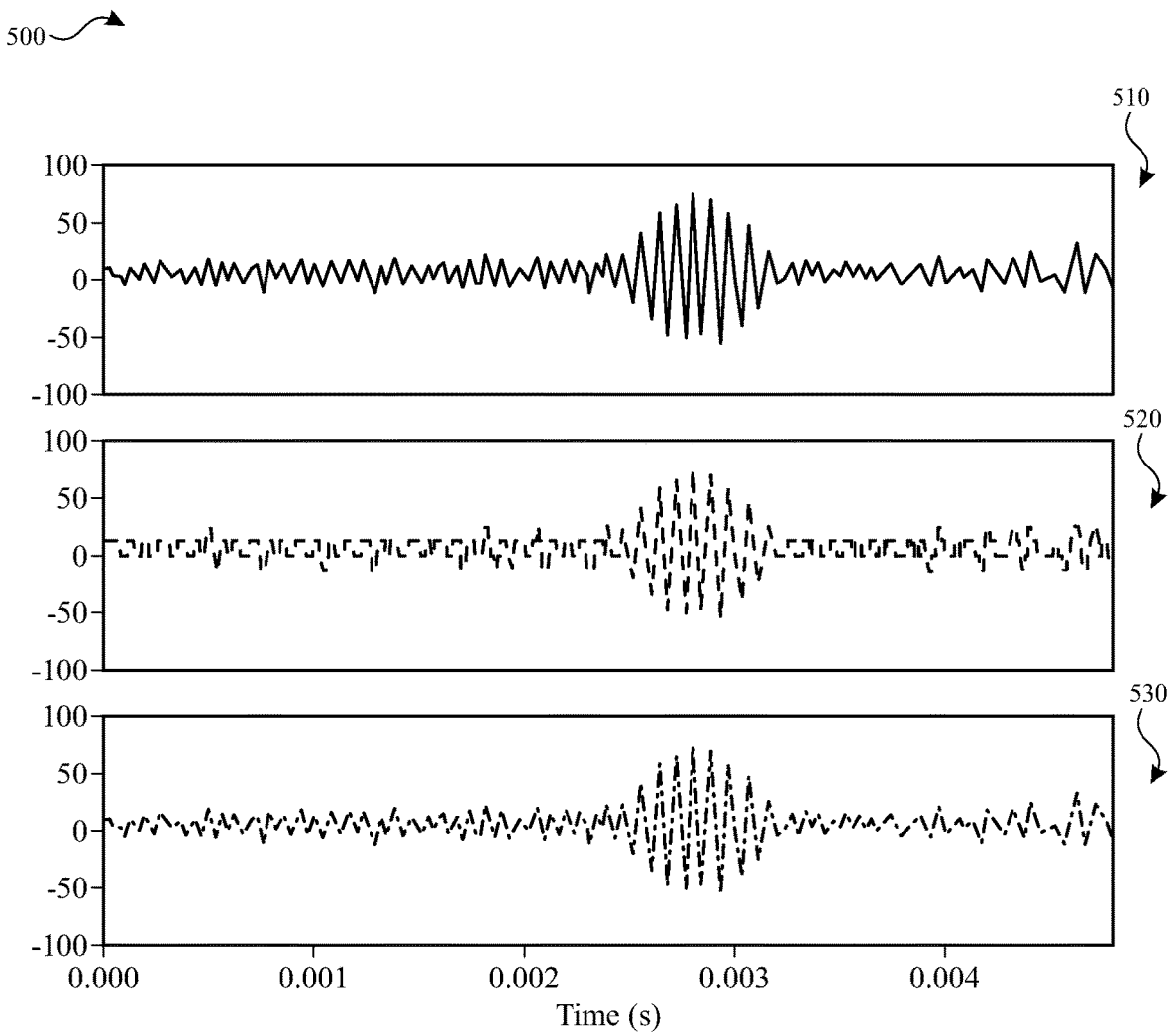
FIG. 5 is a diagram illustrating example analog and digitized signals of a particle detector device, in accordance with one or more aspects of the subject technology.
FIG. 6 is a table providing an example calculated power saving value as a result of using two ADCs to reduce power consumption in an optical particle detection device, in accordance with one or more aspects of the subject technology.

FIG. 5 is a diagram illustrating example analog and digitized signals 500 of a particle detector device, in accordance with one or more aspects of the subject technology.

Example analog and digitized signals 500 include analog signal 510 and digital signals 520 and 530. Digital signal 520 is digitized using a low-resolution ADC (e.g., 4-bit ADC), and digital signal 530 is digitized using a high-resolution ADC (e.g., 12-bit ADC). The resolution of the ADC has a significant effect on the power consumption, as it is understood that power consumption and ADC resolution (n) approximately follow a power-law relationship, such as $2^n$.

FIG. 6 is a table 600 providing an example calculated power saving value as a result of using two ADCs to reduce power consumption in an optical particle detection device, in accordance with one or more aspects of the subject technology. Table 600 shown in FIG. 6 depicts duty cycles of 99% and 1%, respectively, for the always-on mode ADC (e.g., second ADC 430 of FIG. 4) and the detection mode ADC (e.g., first ADC 420 of FIG. 4). The always-on mode ADC and the detection mode ADC are considered to have resolutions of 4 and 12 bits, respectively. The resultant power reduction, as shown in table 600, is 98.6%. Being a significant number, this figure indicates that the power reduction scheme of FIG. 4 is very effective.

Figure 7:
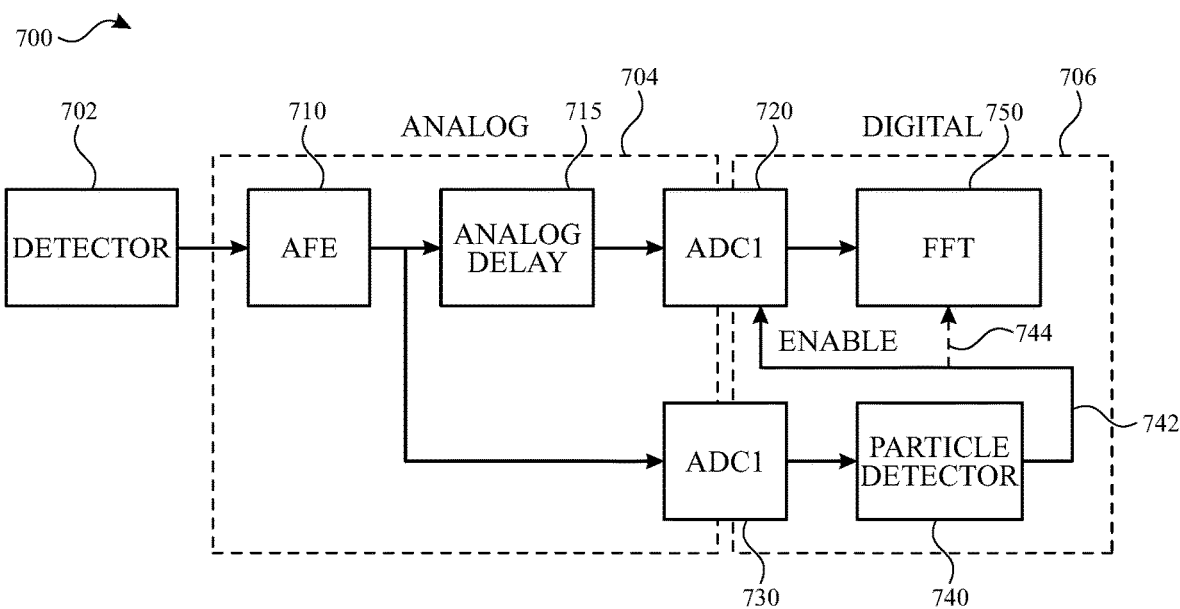
FIG. 7 is a block diagram illustrating an example circuit using two ADCs to reduce power consumption in an optical particle detection device, in accordance with one or more aspects of the subject technology.

FIG. 7 is a block diagram illustrating an example circuit 700 using two ADCs to reduce power consumption in an optical particle detection device, in accordance with one or more aspects of the subject technology. Example circuit 700 includes a detector 702 and an ASIC including an analog section 704 and a digital section 706. Detector 702 is an optical detector similar to the detector 402 of FIG. 4. Analog section 704 includes AFE circuit 710, an analog delay circuit 715, a first portion of a first ADC circuit 720 and a first portion of a second ADC circuit 730. Digital section 706 is similar to the digital section 406 of FIG. 4 and includes a second section of first ADC circuit 720, a second section of second ADC circuit 730, a particle detector module 740 and a dedicated processor 750. Thus, example circuit 700 is similar to the example circuit 400 of FIG. 4, except for addition of analog delay circuit 715 that is introduced in FIG. 7. Analog delay circuit 715 can provide a suitable delay to the conditioned analog signal of AFE 710 that is provided to first ADC circuit 720. The delay of analog delay circuit 715 can be set as the longest anticipated travel time of a particle through the sensing volume (cavity) of the particle detector housing plus the processing time of particle detector module 740. The delay provided by analog delay circuit 715 can compensate for time delay before an actual particle signal is processed by first ADC circuit 720.

Figure 8:
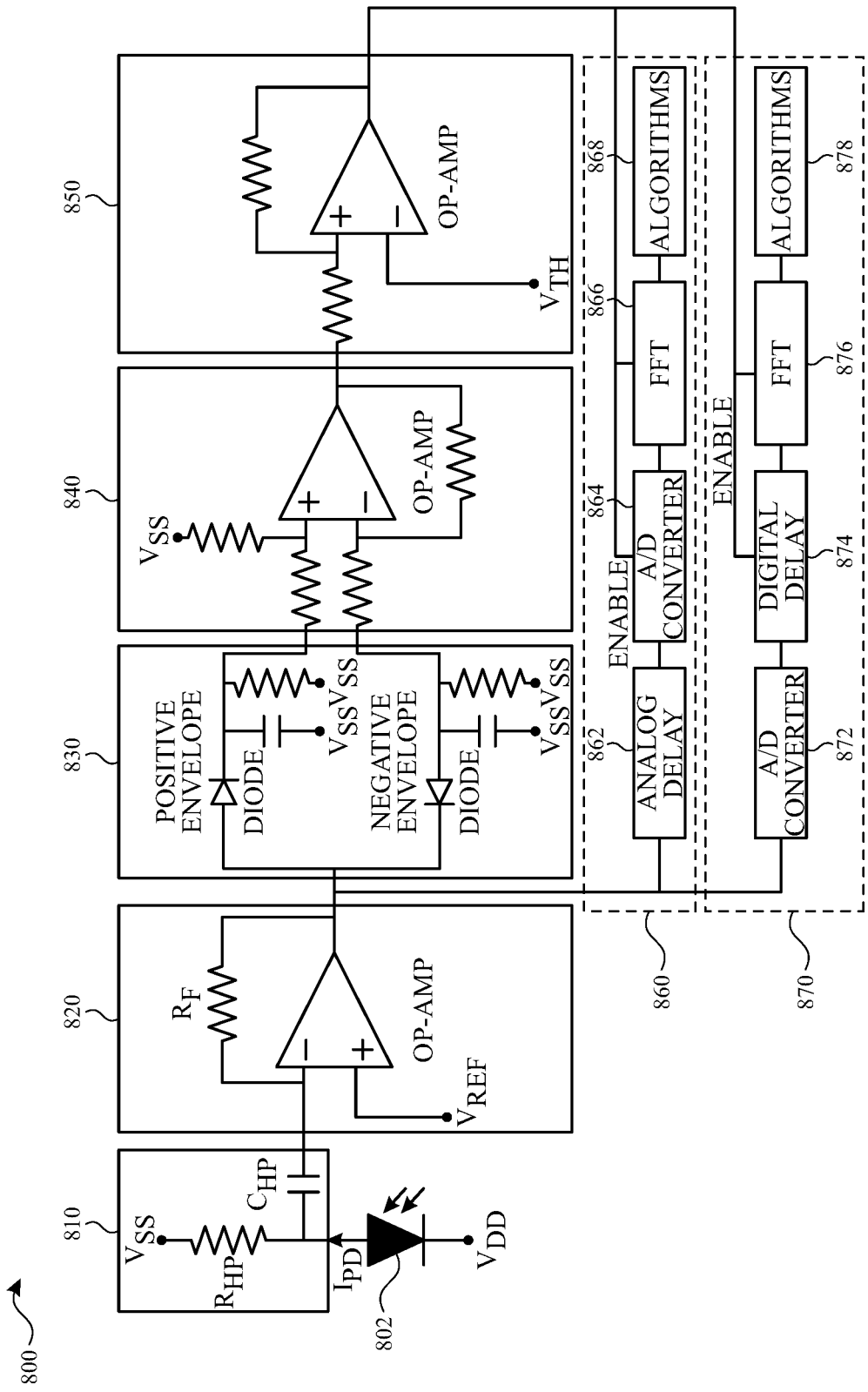
FIG. 8 is a block diagram illustrating an example circuit using envelope detectors and thresholding to reduce power consumption in an optical particle detection device, in accordance with one or more aspects of the subject technology.

FIG. 8 is a block diagram illustrating an example circuit 800 using envelope detectors and thresholding to reduce power consumption in an optical particle detection device, in accordance with one or more aspects of the subject technology. Example circuit 800 includes an optical detector (e.g., a photodetector, such as a photodiode) 802, a high-pass filter (HPF) 810, an amplifier circuit 820, an envelope detector circuit 830, a differential amplifier 840, a comparator with hysteresis 850 and one of a first sub-circuit 860 or a second sub-circuit 870. HPF 810 is a known circuit and can block a DC component of the optical detector signal from reaching amplifier circuit 820. Amplifier circuit 820 can be a preamplifier that can suitably amplify the optical detector signal for further processing. An envelope detector is a known diode envelope detector that can detect both positive and negative envelopes of a particle signal (e.g., 202 of FIG. 2).

The envelope signals generated by envelope detector circuit 830 are amplified by differential amplifier 840, which is an OP-AMP amplifier circuit that produces a single voltage output. The output voltage of differential amplifier 840 is sent to comparator 850 that is a known hysteresis comparator formed of an OP-AMP and suitable resistors. Comparator 850 compares the amplified envelope signal with a threshold voltage ($V_{TH}$) and generates an output pulse 852, only when the envelope detector output is larger than the threshold voltage plus the hysteresis value. The threshold voltage is set to distinguish the particle signal from the noise floor (e.g., 204 of FIG. 2). In some implementations, envelope detector circuit 830 can be one-sided (positive or negative only). In that case, the differential amplifier would be converted to a single-ended amplifier, and the threshold voltage would also be halved.

In some implementations, output pulse 852 of comparator 850 is used as an enable signal for an ADC 864 of first sub-circuit 860. In one or more implementations, sub-circuit 860 includes an analog delay 862, an ADC 864 and a dedicated processor 866, which can use algorithms 868. Analog delay 862 is a known circuit. ADC 864 can be a high-speed and high-resolution ADC that is normally in a standby mode and is activated by the enable signal (e.g., output pulse 852 of comparator 850). Dedicated processor 866 can use algorithms 868 for further processing of the digitized signal provided by the ADC 864, according to an application requested by a host device (e.g., a smartphone or a smartwatch).

In one or more implementations, output pulse 852 of comparator 850 is used as an enable signal for a dedicated processor 876 of second sub-circuit 870. In some implementations, sub-circuit 870 includes an ADC circuit 872, a digital delay 874 and a dedicated processor 876, which can use algorithms 878. Digital delay 874 is a known circuit, and for example, can be realized by a storage device (e.g., RAM). ADC 872 can be a high-speed and high-resolution ADC. Dedicated processor 876 can use algorithms 878 for further processing of the digitized signal provided by the ADC 872, according to an application requested by a host device (e.g., a smartphone or a smartwatch). Dedicated processor 876 is generally in a standby mode and can be activated by the enable signal (e.g., output pulse 852). Further, the enable signal can be used to instruct digital delay 874 to dump data to dedicated processor 876.

Using any of first and second sub-circuits 860 or 870 in example circuit 800, warrants a low-power consumption. For example, in case of first sub-circuit 860, the high-speed and high-resolution ADC (e.g. ADC 864) is only activated when a particle signal is detected, and in case of second sub-circuit 870, dedicated processor 876 is activated by the enable signal and is otherwise in a standby mode.

Figure 9:
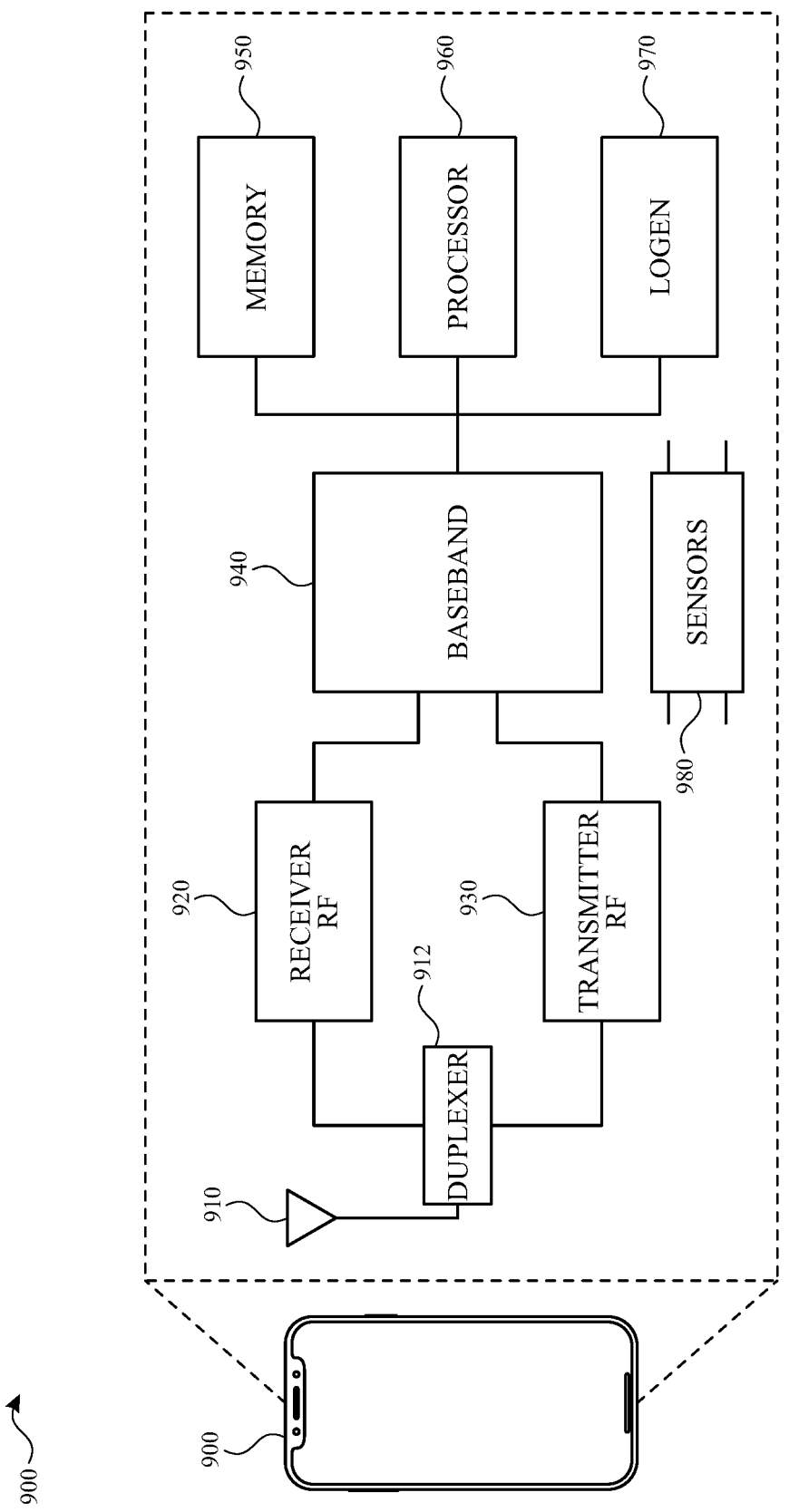
FIG. 9 is a block diagram illustrating an example wireless communication device, within which an application-specific integrated circuit (ASIC) of the subject technology can be integrated.

FIG. 9 is a block diagram illustrating an example wireless communication device, within which the ASIC of the subject technology can be integrated. The wireless communication device 900 may comprise a radio-frequency (RF) antenna 910, a duplexer 912, a receiver 920, a transmitter 930, a baseband processing module 940, a memory 950, a processor 960, a local oscillator generator (LOGEN) 970, one or more sensors 980 and an ASIC 990. In various embodiments of the subject technology, one or more of the blocks represented in FIG. 9 may be integrated on one or more semiconductor substrates. For example, the blocks 920-970 may be realized in a single semiconductor chip or a single system on a semiconductor chip, or may be realized in a multi-semiconductor chip semiconductor chipset.

The receiver 920 may comprise suitable logic circuitry and/or code that may be operable to receive and process signals from the RF antenna 910. The receiver 920 may, for example, be operable to amplify and/or down-convert received wireless signals. In various embodiments of the subject technology, the receiver 920 may be operable to cancel noise in received signals and may be linear over a wide range of frequencies. In this manner, the receiver 920 may be suitable for receiving signals in accordance with a variety of wireless standards, Wi-Fi, WiMAX, Bluetooth, and various cellular standards. In various embodiments of the subject technology, the receiver 920 may not require any surface-acoustic wave (SAW) filters and few or no off-semiconductor chip discrete components such as large capacitors and inductors.

The transmitter 930 may comprise suitable logic circuitry and/or code that may be operable to process and transmit signals from the RF antenna 910. The transmitter 930 may, for example, be operable to up-convert baseband signals to RF signals and amplify RF signals. In various embodiments of the subject technology, the transmitter 930 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 930 may be operable to provide signals for further amplification by one or more power amplifiers.

The duplexer 912 may provide isolation in the transmit band to avoid saturation of the receiver 920 or damaging parts of the receiver 920, and to relax one or more design requirements of the receiver 920. Furthermore, the duplexer 912 may attenuate the noise in the receive band. The duplexer 912 may be operable in multiple frequency bands of various wireless standards.

The baseband processing module 940 may comprise suitable logic, circuitry, interfaces, and/or code that may be operable to perform processing of baseband signals. The baseband processing module 940 may, for example, analyze received signals and generate control and/or feedback signals for configuring various components of the wireless communication device 900, such as the receiver 920. The baseband processing module 940 may be operable to encode, decode, transcode, modulate, demodulate, encrypt, decrypt, scramble, descramble, and/or otherwise process data in accordance with one or more wireless standards.

The processor 960 may comprise suitable logic, circuitry, and/or code that may enable processing data and/or controlling operations of the wireless communication device 900. In this regard, the processor 960 may be enabled to provide control signals to various other portions of the wireless communication device 900. The processor 960 may also control transfers of data between various portions of the wireless communication device 900. Additionally, the processor 960 may enable implementation of an operating system or otherwise execute code to manage operations of the wireless communication device 900.

The memory 950 may comprise suitable logic, circuitry, and/or code that may enable storage of various types of information such as received data, generated data, code, and/or configuration information. The memory 950 may comprise, for example, RAM, ROM, flash, and/or magnetic storage. In various embodiment of the subject technology, information stored in the memory 950 may be utilized for configuring the receiver 920 and/or the baseband processing module 940.

The local oscillator generator (LOGEN) 970 may comprise suitable logic, circuitry, interfaces, and/or code that may be operable to generate one or more oscillating signals of one or more frequencies. The LOGEN 970 may be operable to generate digital and/or analog signals. In this manner, the LOGEN 970 may be operable to generate one or more clock signals and/or sinusoidal signals. Characteristics of the oscillating signals such as the frequency and duty cycle may be determined based on one or more control signals from, for example, the processor 960 and/or the baseband processing module 940.

In operation, the processor 960 may configure the various components of the wireless communication device 900 based on a wireless standard according to which it is desired to receive signals. Wireless signals may be received via the RF antenna 910 and amplified and down-converted by the receiver 920. The baseband processing module 940 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 950, and/or information affecting and/or enabling operation of the wireless communication device 900. The baseband processing module 940 may modulate, encode, and perform other processing on audio, video, and/or control signals to be transmitted by the transmitter 930 in accordance with various wireless standards.

The one or more sensors 980 may include a number of environmental sensor such as, gas sensors, pressure sensors, particle sensors and other sensors. The ASIC 990 can include any of the circuits of FIGS. 3, 4, 7 and 8 described above to process the signals received from the one or more sensors 980 to benefit from a significantly reduced power consumption of these circuits.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A portable communication device, the device comprising:
   one or more optical detectors configured to generate analog signals in response to a change in one of an intra-cavity or an emitted optical power of a light source due to a light backscattered from a particle; and
   an application-specific integrated circuit (ASIC) coupled to the one or more optical detectors, the ASIC comprising:
   an envelope detector configured to detect one or more envelopes of the analog signals and to generate an envelope signal;
   a comparator circuit configured to generate an enable signal based on the envelope signal; an analog-to-digital converter (ADC) circuit configured to receive the enable signal and convert the analog signals from the one or more optical detectors to digital signals in response to the enable signal; and
   a processor coupled to the ADC digital delay circuit and configured to start processing the digital signals in response to the enable signal, wherein using the enable signal allows reducing power consumption of the ADC circuit and the processing circuit.

2. The device of claim 1, wherein the ASIC is configured to reduce power consumption of the device, and wherein the device further comprises an analog front-end (AFE) circuit configured to condition the analog signals for digital conversion by the ADC.

3. The device of claim 2, further comprising a digital delay circuit to store the digital signals from the ADC for a predetermined time interval, wherein the predetermined time interval comprises a dynamically variable time interval that is programmable and can be set to a suitable value based on particle characteristics, wherein the particle characteristics include at least a longest anticipated travel time of the particle in a sensing volume associated with the one or more optical detectors.

4. The device of claim 3, wherein the digital delay circuit is configured to receive a release signal from the particle detector module and to release the digital signals to the processor upon receipt of the release signal.

5. The device of claim 2, wherein the comparator circuit is configured to compare a voltage signal generated based on the envelope signal with a threshold voltage and generate the enable signal in response to the voltage signal exceeding the threshold voltage.

6. The device of claim 2, wherein the processor is in a standby mode before receiving the enable signal, and wherein the processor is enabled by the enable signal for a preset time interval.

7. The device of claim 6, wherein the processor comprises a dedicated processor configured to perform a fast-Fourier transform (FFT) algorithm to generate a frequency-domain characteristic of the digital signals.

8. A portable communication device, the device comprising:
   one or more optical detectors configured to generate analog signals in response to a change in one of an intra-cavity or an emitted optical power of a light source due to a light backscattered from a particle; and
   an application-specific integrated circuit (ASIC) coupled to the one or more optical detectors, the ASIC comprising:
   an analog front-end (AFE) circuit configured to condition the analog signals from the one or more optical detectors for digital conversion;
   an envelope detector configured to detect one or more envelopes of the analog signals and to generate an envelope signal;
   a comparator circuit configured to generate an enable signal based on the envelope signal;
   a first analog-to-digital converter (ADC) circuit configured to receive the enable signal and convert the conditioned analog signals to a first digital signal in response to the enable signal;
   a digital delay circuit to store the first digital signals for a predetermined time interval to generate a delayed digital signal; and
   a processing circuit configured to analyze the delayed digital signal in response to the enable signal, wherein using the enable signal allows reducing power consumption of the first ADC circuit and the processing circuit.

9. The device of claim 8, wherein the ASIC is configured to reduce power consumption of the device, and wherein the the processing circuit comprises a dedicated processor configured to perform a fast-fourier transform (FFT) algorithm to generate a frequency-domain characteristic of the first digital signal.

10. The device of claim 9, wherein the enable signal is generated by a comparator circuit, and wherein the the processing circuit is in a standby mode to save power and is activated by the enable signal.

11. The device of claim 8, further comprising a second ADC circuit configured to convert the analog signals to a second digital signal in response to receiving the enable signal, and wherein the second ADC comprises a low-power ADC including a low-resolution and low-speed ADC or a low-resolution and high-speed ADC.

12. The device of claim 11 further comprising an analog delay circuit coupled between the AFE circuit and the second ADC circuit.

13. The device of claim 11, wherein a low-speed ADC has a conversion speed lower than about 10 MSPS, and the low-resolution ADC has a resolution less than 8 bits.

14. A portable communication device, the device comprising:
   one or more optical detectors configured to generate a first signal in response to a change in one of an intra-cavity or an emitted optical power of a light source due to a light backscattered from a particle; and an application-specific integrated circuit (ASIC) coupled to the one or more optical detectors, the ASIC comprising: an amplifier circuit configured to receive the first signal from the optical detector and to generate a second signal;

an envelope detector configured to detect one or more envelopes of the second signal and to generate an envelope signal;

an amplifier configured to receive the envelope signal and to generate a voltage signal;

a comparator circuit configured to compare the voltage signal with a threshold voltage and generate an enable signal, in response to the voltage signal exceeding the threshold voltage; and a mixed-signal circuit including an analog-to-digital converter (ADC) circuit and a dedicated processor and configured to use the enable signal to reduce power consumption of the ADC circuit or the dedicated processor.

15. The device of claim 14, wherein the ASIC is configured to reduce power consumption of the device, wherein the one or more envelopes of the second signal comprise a positive envelope and a negative envelope, wherein the envelope signal comprises a differential envelope signal, and wherein the amplifier comprises a differential amplifier.

16. The device of claim 14, wherein the mixed-signal circuit comprises:
    an analog delay circuit configured to receive the voltage signal and generates a delayed signal; and
    the ADC circuit configured to convert the delayed signal into a digital signal for processing by the dedicated processor.

17. The device of claim 16, wherein the ADC circuit is in a standby mode and is enabled by the enable signal.

18. The device of claim 14, wherein the mixed-signal circuit comprises:
    the ADC circuit configured to convert the voltage signal into a digital signal; and
    a digital delay circuit to store the digital signal.

19. The device of claim 18, wherein the mixed-signal circuit further comprises the dedicated processor, wherein the dedicated processor is in a standby mode and is enabled by the enable signal.

20. The device of claim 14, wherein the one or more envelopes of the second signal comprise one of a positive envelope or a negative envelope, and wherein the amplifier comprises a single-ended amplifier.

* * * * *

UNITED STATES PATENT AND TRADEMARK OFFICE
CERTIFICATE OF CORRECTION

| | |
|---|---|
| PATENT NO. | : 11,353,390 B2 |
| APPLICATION NO. | : 16/725951 |
| DATED | : June 7, 2022 |
| INVENTOR(S) | : Miaolei Yan et al. |

Page 1 of 1

It is certified that error appears in the above-identified patent and that said Letters Patent is hereby corrected as shown below:

In the Claims

Column 12, Lines 43-44 (Claim 9): Replace "wherein the the" with --wherein the--.

Column 12, Line 49 (Claim 10): Replace "wherein the the" with --wherein the--.

Signed and Sealed this
Seventeenth Day of January, 2023

Katherine Kelly Vidal
*Director of the United States Patent and Trademark Office*